United States Patent [19]
Takagi et al.

[11] Patent Number: 4,742,517
[45] Date of Patent: May 3, 1988

[54] INTERLEAVING CIRCUIT

[75] Inventors: Yuji Takagi; Isao Satoh, both of Neyagawa; Tatsuo Sugimura, Kasuya, all of Japan

[73] Assignee: Matsushita Electric Industrial Co., Ltd., Kadoma, Japan

[21] Appl. No.: 862,814

[22] Filed: May 13, 1986

[30] Foreign Application Priority Data

May 14, 1985 [JP] Japan .................................. 60-101823

[51] Int. Cl.$^4$ .............................................. G06F 11/10
[52] U.S. Cl. ............................................. 371/2; 371/37
[58] Field of Search .......................... 371/37, 38, 39, 2

[56] References Cited

U.S. PATENT DOCUMENTS

| | | | |
|---|---|---|---|
| 4,394,642 | 7/1983 | Currie | 371/2 |
| 4,534,031 | 8/1985 | Jewer | 371/2 |
| 4,559,625 | 12/1985 | Berlekamp | 371/2 |
| 4,631,725 | 12/1986 | Takamura | 371/39 |
| 4,633,471 | 12/1986 | Perasa | 371/39 |

*Primary Examiner*—Michael R. Fleming
*Attorney, Agent, or Firm*—Cushman, Darby & Cushman

[57] ABSTRACT

In an interleaving circuit, writing and reading are executed on the two dimensional array memory according to a first address sequence and a second address sequence, and product code errors occurring on the same column are propagated to the columns which are different with each other. The errors are thereby scattered to minimize the decreasing of the error correcting capability of the product codes.

5 Claims, 21 Drawing Sheets

Column address →

| | 0 | 1 | 2 | 3 | 4 | 5 | 6 | 7 | 8 | 9 | 10 | 11 | 12 | 13 | 14 | ... | ... | ... | ... | ... | ... |
|---|---|---|---|---|---|---|---|---|---|---|---|---|---|---|---|---|---|---|---|---|---|
| 0 | 1 | 16 | 31 | 46 | 61 | | | | | | | | | | | | | | | 1561 | 1576 |
| 1 | 2 | 17 | 32 | 47 | 62 | | | | | | | | | | | | | | | 1562 | 1577 |
| 2 | 3 | 18 | 33 | 48 | 63 | | | | | | | | | | | | | | | 1563 | 1578 |
| 3 | 4 | 19 | 34 | 49 | 64 | | | | | | | | | | | | | | | 1564 | 1579 |
| 4 | 5 | 20 | 35 | 50 | 65 | | | | | | | | | | | | | | | 1565 | 1580 |
| 5 | 6 | 21 | 36 | 51 | 66 | | | | | | | | | | | | | | | 1566 | 1581 |
| 6 | 7 | 22 | 37 | 52 | 67 | | | | | | | | | | | | | | | 1567 | 1582 |
| 7 | 8 | 23 | 38 | 53 | 1 | | | | | | | | | | | | | | | 1568 | 1583 |
| 8 | 9 | 24 | 39 | 54 | 1 | | | | | | | | | | | | | | 1569 | 1584 | |
| 9 | 10 | 25 | 40 | 55 | 1 | | | | | | | | | | | | | | 1570 | 1585 | |
| 10 | 11 | 26 | 41 | 56 | | | | | | | | | | | | | | | 1571 | 1586 | |
| 11 | 12 | 27 | 42 | 57 | | | | | | | | | | | | | | | 1572 | 1587 | |
| 12 | 13 | 28 | 43 | 58 | | | | | | | | | | | | | | | 1573 | 1588 | |
| 13 | 14 | 29 | 44 | 59 | | | | | | | | | | | | | | | 1574 | 1589 | |
| 14 | 15 | 30 | 45 | 60 | | | | | | | | | | | | | | | 1575 | 1590 | |

Row address ↓

FIG. 2

| Multiplier | α: | 0 | α | α² | α³ | α⁴ | α⁵ | α⁶ | α⁷ | α⁸ | α⁹ | α¹⁰ | α¹¹ | α¹² | α¹³ | α¹⁴ | 1 | α | α² | — — — | α¹¹ | α¹² | α¹³ | α¹⁴ | 1 |
|---|---|---|---|---|---|---|---|---|---|---|---|---|---|---|---|---|---|---|---|---|---|---|---|---|---|
| | β: | 0 | β | β² | β³ | β⁴ | β⁵ | β⁶ | 1 | β | β² | β³ | β⁴ | β⁵ | β⁶ | 1 | β | β² | β³ | — — — | β³ | β⁴ | β⁵ | β⁶ | 1 |
| | Row address | 1 | 2 | 3 | 4 | 5 | 6 | 7 | 8 | 9 | 10 | 11 | 12 | 13 | 14 | 15 | 16 | 17 | 18 | | 102 | 103 | 104 | 105 | 106 |
| α, β | 1 | 107 | 153 | 179 | 740 | 186 | 127 | 173 | 174 | 160 | 206 | 147 | 193 | 134 | 180 | 121 | 167 | 108 | 154 | | | | | | 212 |
| α, β² | 2 | 213 | 274 | 230 | 291 | 247 | 308 | 264 | 220 | 281 | 237 | 298 | 254 | 315 | 271 | 227 | 288 | 244 | 305 | | | 179 | 120 | 166 | |
| α, β³ | 3 | 319 | | | | | | | | | | | | | | | | | | | 284 | 240 | 301 | 257 | 318 |
| α, β⁴ | 4 | 425 | | | | | | | | | | | | | | | | | | | | | | | 424 |
| α, β⁵ | 5 | 531 | | | | | | | | | | | | | | | | | | | | | | | 530 |
| α, β⁶ | 6 | 637 | | | | | | | | | | | | | | | | | | | | | | | 636 |
| α², β | 7 | 743 | | | | | | | | | | | | | | | | | | | | | | | 742 |
| α², β² | 8 | 849 | | | | | | | | | | | | | | | | | | | | | | | 848 |
| α², β³ | 9 | 955 | | | | | | | | | | | | | | | | | | | | | | | 954 |
| α², β⁴ | 10 | 1061 | | | | | | | | | | | | | | | | | | | | | | | 1060 |
| α², β⁵ | 11 | 1167 | | | | | | | | | | | | | | | | | | | | | | | 1166 |
| α⁴, β | 12 | 1273 | | | | | | | | | | | | | | | | | | | | | | | 1272 |
| α⁴, β² | 13 | 1379 | | | | | | | | | | | | | | | | | | | | | | | 1378 |
| α⁴, β³ | 14 | 1485 | | | | | | | | | | | | | | | | | | | | | | | 1484 |
| α⁴, β⁴ | | | | | | | | | | | | | | | | | | | | | | | | | 1590 |

Column address

Row address

FIG.10(A)
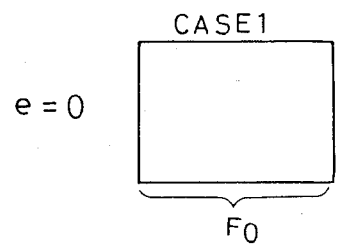
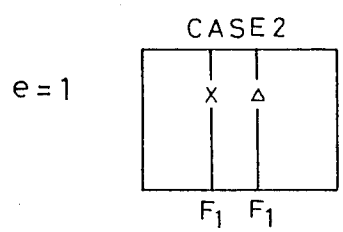
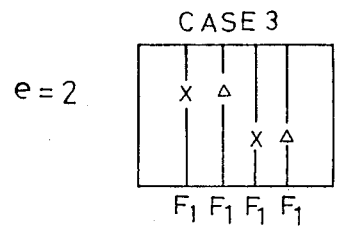 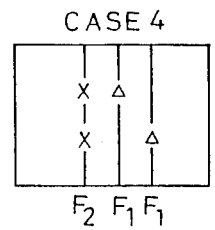
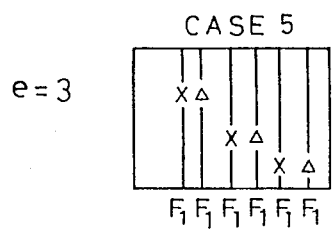 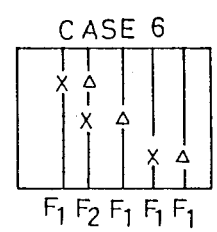 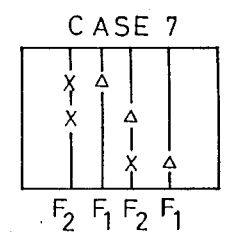
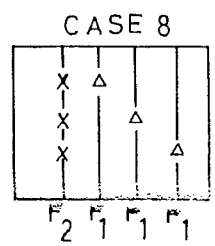

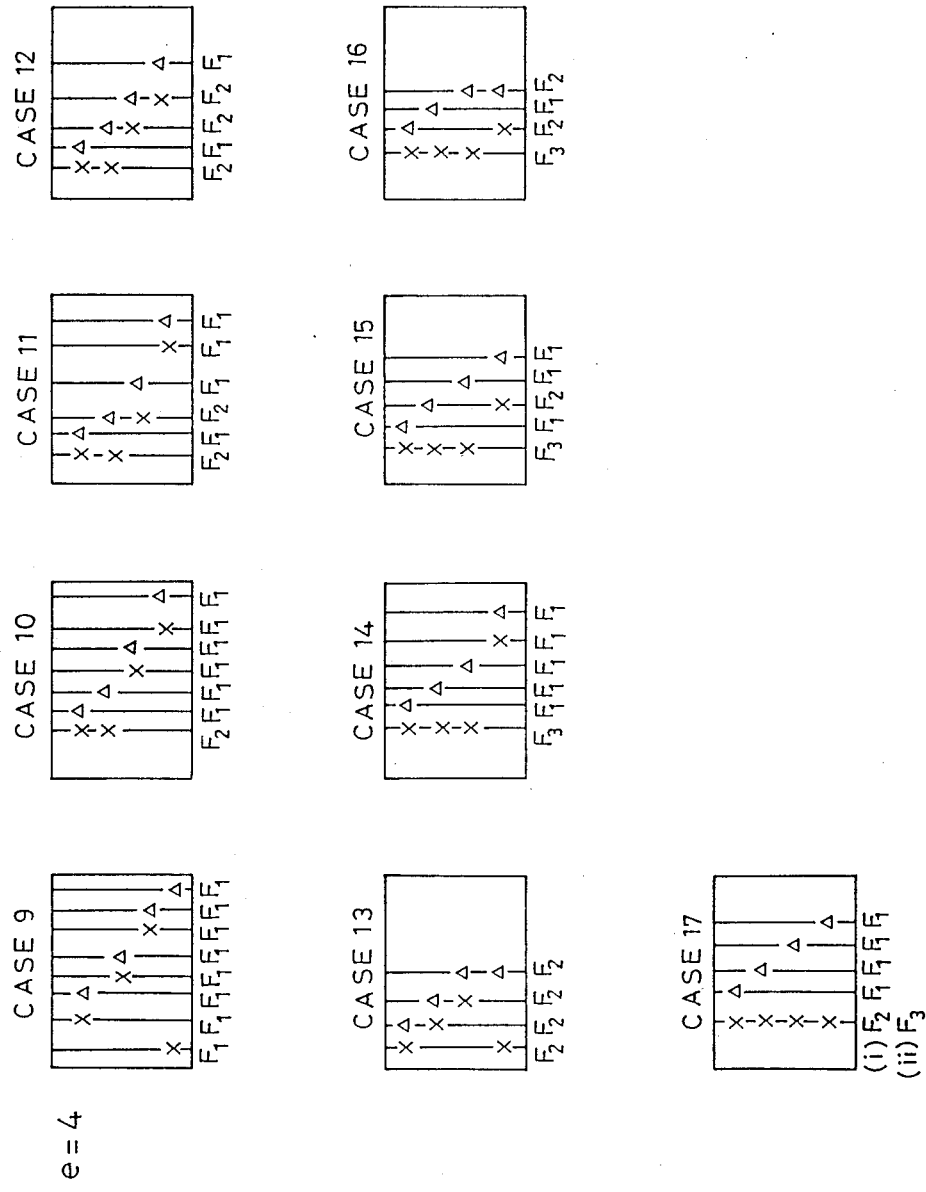

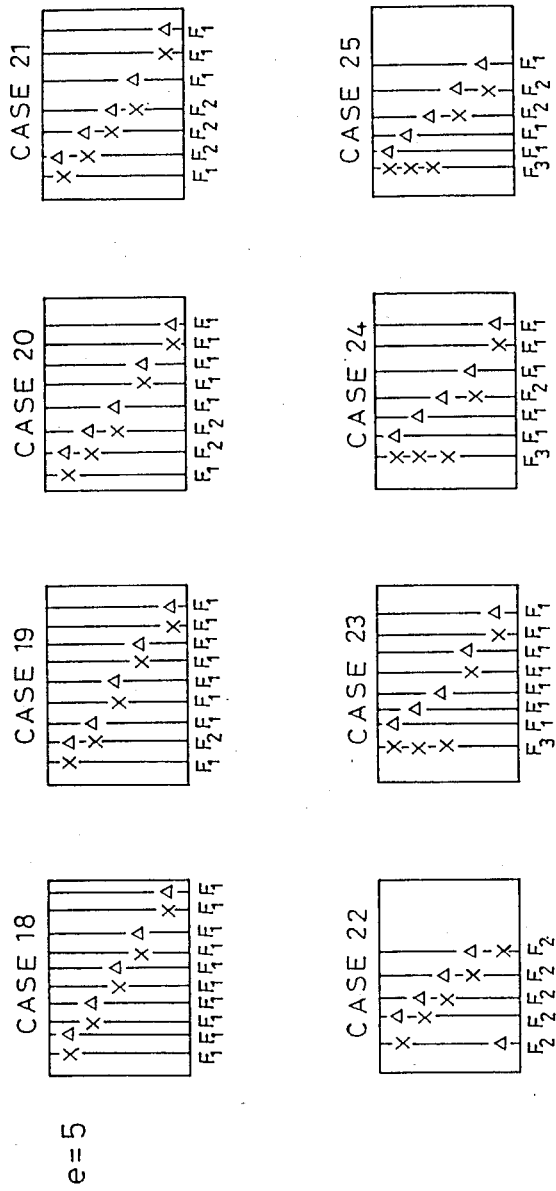
FIG. 10(C)   e=5

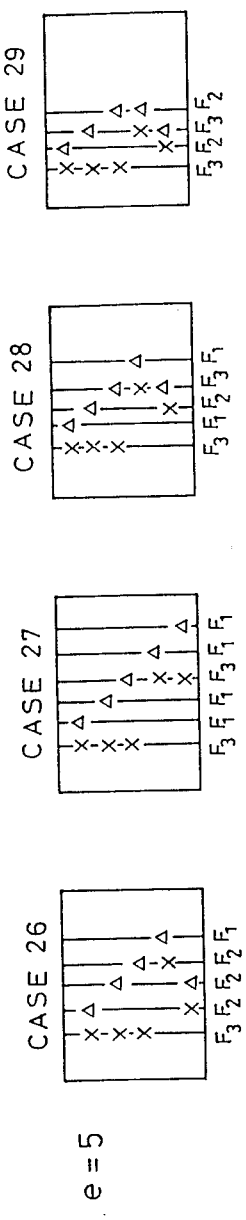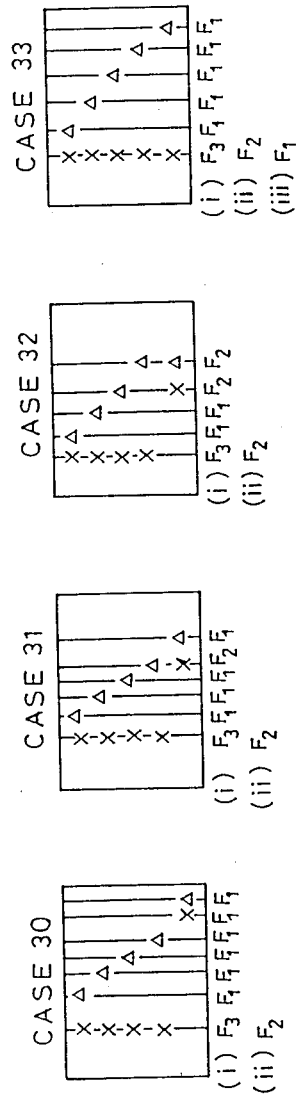
FIG. 10(D)

FIG. 14 (A)
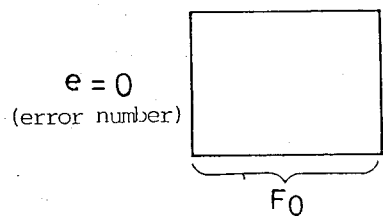
CASE 1
e = 0
(error number)
$F_0$
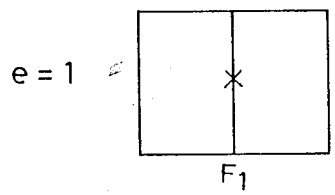
CASE 2
e = 1
$F_1$
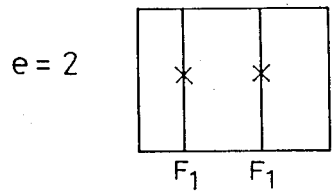
CASE 3
e = 2
$F_1$ $F_1$
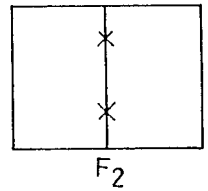
CASE 4
$F_2$
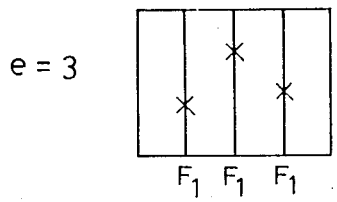
CASE 5
e = 3
$F_1$ $F_1$ $F_1$
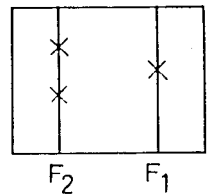
CASE 6
$F_2$ $F_1$
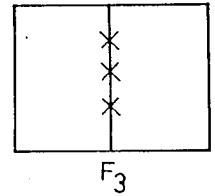
CASE 7
$F_3$

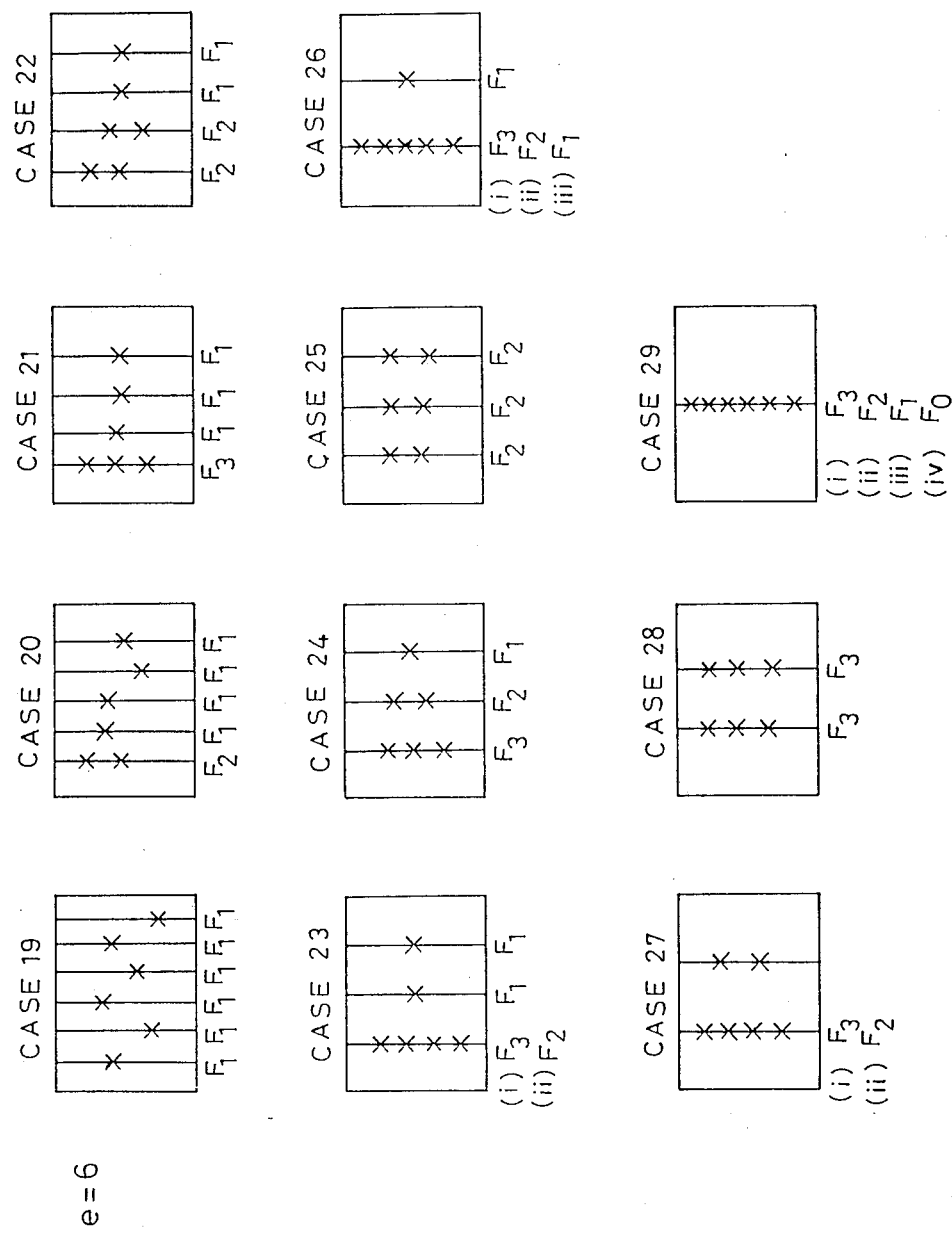
FIG.14 (C)  e=6

X: Actual error

△: Propagated error

FIG. 16 (A)
$e = 0$
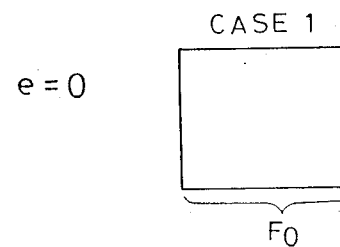
$e = 1$
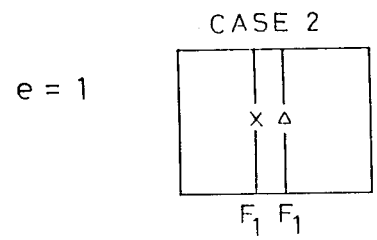
$e = 2$
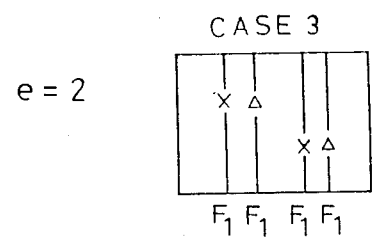   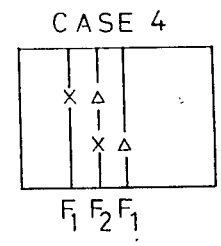
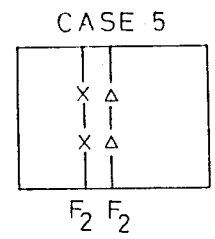

INTERLEAVING CIRCUIT

FIELD OF THE INVENTION AND RELATED ART STATEMENT

1. Field of the Invention

The present invention is related generally to an interleaving circuit, and particularly to an interleaving circuit having a close connection with a coding and decoding apparatus for product codes to be used in an information recording and reproducing apparatus such as an optical disk filing system.

Further, the present invention related to an interleaving circuit which can reduce the influence of error propagation on error correction capability of the product codes, thereby to minimize decreasing of the error correction capability of the product codes, when a high density recording method producing error propagation is used such as a (1,7) Run Length Limited Code method (hereafter abbreviated as (1,7)RLLC) or a (2,7) Run Length Limited Code method (hereafter abbreviated as (2,7)RLLC).

2. Description of the Related Art

When digital data is transmitted or recorded, errors are produced in the data by various causes. Error correcting codes have been used in the prior art in order to avoid the errors that occur in a usual information device. In order to properly use these codes, a mixture of a random error and a burst error, the so-called composite error, produced in a data communication channel or recording media having poor reliability or characteristics with regard to error, is required to be correct. The burst error is randomized by the interleaving circuit and the randomized error is corrected. The product codes have such advantages that the decoding of the product codes is easy in addition to having superior error correction capability. The product codes can have good harmony with the interleaving circuit for correcting composite errors. Therefore, the product codes are used for correcting errors in the digital data transmission or the digital data recording.

FIG. 11 is a diagram showing the principle of the product codes.

Each first code 33 has a code length m and each second code 34 has code length n. An area 35 represents information data, and an area 36 represents check data. As shown in FIG. 11, redundancy for error detection and correction is added to each column of the information data 35, thereby to produce the first codes 33, 33, . . . having code length m. Next, redundancy for error detection and correction is added to each row of the first codes 33, 33, . . . , thereby to produce the second codes 34, 34, . . . having code length n. According to the above sequence, the product codes of code length m×n are produced. The same product codes can be produced also by reversing the order of producing the first code 33 and the second code 34, that is, by first adding redundancy to each row of the information data 35, thereby to produce the second codes 34, 34, . . . and next adding redundancy to each column of the second codes 34, 34, . . . thereby to produce the first codes 33, 33, . . . .

FIG. 12 shows a general constitution of the known information recording and reproducing apparatus. A coding circuit 37 is a circuit for producing the product codes. A decoding circuit 38 is a circuit for decoding the product codes. A circuit 39 is the interleaving circuit for the product codes. A modulator 40 modulates outputs of the interleaving circuit 39, thereby to produce a modulated data, and a demodulator 41 demodulates a reproduced data 45.

In such information recording and reproducing apparatus, during recording time, data 42 is applied to the coding circuit 37, and a coded data 7 of the product codes is produced by the coding circuit 37 and is applied to the interleaving circuit 39. The coded data 7 is converted to a record data 9 by the interleaving circuit 39 and applied to the modulator 40. The record data 9 is modulated by the modulator 40 and is issued as a modulated data 44.

During reproducing time, a reproduced data 45 is demodulated by the demodulator 41. A demodulated data 10 from the demodulator 41 is de-interleaved by the interleaving circuit 39 and issued as a decoded data 8. The decoded data 8 is applied to the decoding circuit 38. The decoding circuit 38 detects and corrects errors in the decoded data 8 and issues corrected data 43.

Hitherto, the interleaving circuit having a maximum distance separation is used in the interleavng circuit of the information recording and reproducing apparatus using product codes. That is, in FIG. 11, defining a symbol of i rows and j columns is represented as $S_{ij}$, in the recording time, a data is recorded in a memory area of the interleaving circuit in the order of $$S_{11}, S_{21}, S_{31}, \ldots, S_{m1},$$
$$S_{12}, S_{22}, S_{32}, \ldots, S_{m2},$$
$$\vdots$$
$$S_{1n}, S_{2n}, S_{3n}, \ldots, S_{mn}.$$

Next, the data is read out in the order of $$S_{11}, S_{12}, S_{13}, \ldots, S_{1n},$$
$$S_{21}, S_{22}, S_{23}, \ldots, S_{2n},$$
$$\vdots$$
$$S_{m1}, S_{m2}, S_{m3}, \ldots, S_{mn}.$$

Thus, the interleaving operation is executed.

In reproducing time, the data is recorded in the memory of the interleaving circuit in the order of $$S_{11}, S_{12}, S_{13}, \ldots, S_{1n},$$
$$S_{21}, S_{22}, S_{23}, \ldots, S_{2n},$$
$$\vdots$$
$$S_{m1}, S_{m2}, S_{m3}, \ldots, S_{mn}.$$

Next, the data is read out in the order of $$S_{11}, S_{21}, S_{31}, \ldots, S_{m1},$$
$$S_{12}, S_{22}, S_{32}, \ldots, S_{m2},$$
$$\vdots$$
$$S_{1n}, S_{2n}, S_{3n}, \ldots, S_{mn}.$$

Thus, the de-interleaving operation is executed.

The decoding circuit for the product codes is described as follows.

In the codes having two or more elements such as product codes, the decoding of each element should be related organically to each other. For example, in product codes having two codes, after the first code is decoded, the second code is decoded by using the result of the decoding of the first code. Further, if necessary, the first code is decoded again. Thus, such repetition of decoding is required. Therefore, in the decoding of the product codes, decoding of each code is comparably easy. However, an algorithm for organically coupling those decodings is complicated. A general algorithm has not yet developed.

However, with regard to the decoding method of the product codes having minimum distance 2t comprising a code of minimum distance 2 and a code of minimum distance t, an algorithm for error correction of (t−1) or less symbols and for error detection of t symbols, which are the theoretical limitation, is represented by Japenese Patent Application No. Sho 58-223601 (applicant: Matsushita Electric Industrial Co., Ltd., inventor: Sugimura et al.), (hereafter abbreviated as Sugimura Patent Application), by U.S. application of Ser. No. 649,718 (inventor: Sugimura et al.).

According to the Sugimura Patent Application, first the decoding of the first code is executed with regard to the decoding of product codes of minimum distance 2t wherein, the product codes comprises a first code of code length m and minimum distance t and a second code of code length n and minimum distance 2 constituted by parity check sum. An error number flag is made during the decoding operation of the first code. That is, with regard to the first code of minimum distance t, $$\left\lfloor \frac{t-1}{2} \right\rfloor$$

or less error correction and $$\left\lfloor \frac{t+1}{2} \right\rfloor$$

or more error detection can be made. Where, $\lfloor x \rfloor$ indicates a maximum integer not exceeding x. In the decoding operation of the first code, either one of error number flags $F_i$ as shown below is raised.

no error: $F_0$ single error correction: $F_1$ $\left\lfloor \frac{t-1}{2} \right\rfloor$ error correction: $F_{\left\lfloor \frac{t-1}{2} \right\rfloor}$ error detection: $F_{\left\lfloor \frac{t+1}{2} \right\rfloor}$ In the case that any errors exceeding the correction capability of the first codes take place, it is not determined whether error correction is not processed and $$F_{\left\lfloor \frac{t+1}{2} \right\rfloor}$$

is raised or a false j error correction is executed and $F_j$ is raised. As has been described above, decoding of n first codes is performed.

Next, a statistical processing of the above-mentioned n error number flag is executed, and the result is classified into three decoding modes. First, the error number flag $F_i$ are counted for each error number. Letting the number of occurrence of error number flag $F_i$ is $C_i$, the equation holds below:

$$\sum_{i=0}^{\left\lfloor \frac{t+1}{2} \right\rfloor} C_i = n.$$

Procedures of statistical processing and subsequent processing are described below. Here, higher priority order is given for larger subscript i, starting from those $C_i$ having the largest subscripts i. And, they are classified into decoding modes shown below:

(i) Decoding mode 1:

$$C_{\left\lfloor \frac{t+1}{2} \right\rfloor} > 2,$$

i.e., a first case that error detection is executed two times or more.

(ii) Decoding mode 2:

A second case that non-zero highest priority order $C_i$ is 1.

(iii) Decoding mode 3:

A third case other than the above two modes.

In these three decoding modes, the error correction operation or the error detection operation using the second codes is performed as follows:

(a) Decoding mode 1:

Detection of unconditionally un-correctable errors is asserted.

(b) Decoding mode 2:

A pointer is placed on a column of the first codes wherein error number flags $F_i$ for which non-zero highest priority order $G_i$ is set to be 1 occurs. Then, taking check sums in the second codes of reproducing system, they are added to the column on which the pointer is placed in the exclusive logical sum. Alternatively, excluding the column on which the pointer is placed, check sums of the second codes are taken, then the pointer-placed column is replaced for the check sums.

(c) Decoding mode 3:

Check sums in the first codes of reproducing system are taken as follows:

(i) In case that check sum are zero: No error.

(ii) in case that check sums are not zero: Detection of un-correctable errors is asserted.

As has been explained above, according to the algorithm of Sugimura Patent Application, by performing decoding of the product codes, in the product codes of the minimum distance 2t, error correction of (t−1) symbols or less and error detection of t symbols becomes possible.

The above-mentioned decoding of product codes is described in detail as follows.

FIG. 13 is a diagram of a constitution of the product codes of minimum distance 12 comprising a first code of code length 15, minimum distance 6 and a second code of code length 106, minimum distance 2 constituted by the check sum.

Decoding of the above product codes according to the decoding algorithm of the Sugimura Patent Application is described as follows.

At first, the first code 46 is decoded. Since the first code has minimum distance 6, two or less error correction and three errors detection can be executed. Therefore, in decoding processing of the first code 46, error number flags $F_i$ is raised as below.

| | |
|---|---|
| no error | $F_0$ |
| single error correction | $F_1$ |
| two error correction | $F_2$ |
| three error detection | $F_3$ |

Here, FIG. 14 shows all error types of six symbols or less. In FIG. 14, cases (CASE) are classified in accordance with error number e produced in whole product codes and error number produced in the first code 46. Error number flags produced in decoding processing of the first code 46 are indicated under respective cases (although $F_0$ i not shown).

These cases are classified to decoding modes as follows.
(a) Decoding mode 1:
  Case 28
(b) Decoding mode 2:
  Cases 2, 4, 6, 7, 9, 10, 11(i), 11(ii), 13, 14, 16(i), 16(ii), 17, 18(i), 18(ii), 18(iii), 20, 21, 23(i), 23(ii), 24, 26(i), 26(ii), 27(i), 29(i), 29(ii), 29(iii).
(c) Decoding mode 3:
  Cases 1, 3, 5, 8, 12, 15, 19, 22, 25, 26(iii), 27(ii), 29(iv).

In the decoding mode 1, detection of unconditionally un-correctable errors is asserted. In the decoding mode 2, all errors are corrected by decoding second code 47. In the decoding mode 3, detection of un-correctable errors is asserted in cases 26(ii), 27(ii), 29(iv) by check sum inspection, and error correction is executed in the other cases. As mentioned above, 5 error correction and 6 error detection which are theoretical limitation of product codes having minimum distance 12 can be executed, according to Sugimura Patent Application.

Correction of burst error of symbol length 213 at maximum is executed by using the usual interleaving method of maximum distance separation since interleaving depth is 106 in the example.

However, problems mentioned below occur when the product codes are transmitted or recorded on communication channels or recording media.

Recently, high density recording method is frequently used in a digital audio system such as CD (compact disk) or DAT (digital audio tape) or in an information recording and reproducing apparatus such as optical disk filing system. For example, MFM (modified FM), (1,7)RLLC and (2,7)RLLC methods etc. are known. Then, in some high density recording methods such as (1,7)RLLC or (2,7)RLLC, 1 bit error on the transmission channel or the recording media becomes one or more bits error after demodulation.

For example, in (2,7)RLLC according to ENCODER and DECODER of U.S. Pat. No. 4,115,768, 8 bits data after modulation is decoded. Therefore, 1 bit data error after modulation is demodulated being added with 2 bits or more error.

FIG. 15 shows a diagram of error propagation status after demodulation with regard to 1 bit error on the recording media or the transmission channel, when the product codes is interleft by the conventional interleaving circuit having maximum distance separation and recorded or transmitted after modulated by the modulation method having error propagation characteristics. In FIG. 15, X mark shows symbol error directly produced by the error on recording media or are transmission channel. A Δ mark shows symbol error produced by the error propagation. As shown in FIG. 15, in the product codes using the conventional interleaving circuit, the error is propagated to symbols of next neighboring column. Therefore, when plural errors are produced in the same column and the errors are propagated respectively, the errors are propagated to the next column respectively, and the propagated plural errors result in being arranged on the same column. Accordingly, the error correction capability of the product codes is largely decreased.

For example, when the product codes in FIG. 13 is decoded according to the Sugimura's algorithm, 5 error correction and 6 error detection which are theoretical limitation of the product codes having minimum distance 12 can be executed. However, when the product codes are interleft by using the conventional interleaving circuit having maximum distance separation and the errors are propagated, the occurrence of three errors makes sometimes the error correction impossible. That is, although the product codes have minimum distance 12, it only has 2 error correction and 3 error detection.

FIG. 16 shows all error types when three or less symbol errors are produced. FIG. 16 shows case where every error is propagated to produce two symbol errors. In FIG. 16, the cases are classified in accordance with error number e produced in whole product codes and error number produced in the first code 46 including errors produced by the error propagation. Error number flags produced in the decoding processing of the first code 46 is shown under each case (but $F_0$ is not indicated). Original errors on the recording media or transmission channel are represented by X mark and the errors produced by the error propagation are represented by Δ mark.

These cases are classified to decoding modes as follows.
(a) Decoding mode 1:
  Case 10,
(b) Decoding mode 2:
  Cases 4, 7, 9,
(c) Decoding mode 3:
  Cases 1, 2, 3, 5, 6, 8, In the decoding mode 1, detection of unconditionally un-correctable error is asserted. In the decoding modes 2 and 3, error correction is executed.

Thus, the conventional system has such problem that the error correction capability of the product codes is largely decreased, when the product codes are recorded or transmitted by using the conventional interleaving circuit having maximum distance separation, in case the modulation method has an error propagation property.

OBJECT AND SUMMARY OF THE INVENTION

The object of the present invention is to offer such interleaving circuit which can reduce the influence of error propagation, thereby to minimize a decrease in error correction capability of the product codes.

An interleaving circuit in accordance with the present invention comprises:

A memory area having (m×n) matrix blocks, a first address generator generating such first address sequence:

$(R_1, C_1), (R_2, C_1), (R_3, C_1), \ldots, (R_m, C_1),$ $(R_1, C_2), (R_2, C_2), (R_3, C_2), \ldots, (R_m, C_2),$ $(R_1, C_n), (R_2, C_n), (R_3, C_n), \ldots, (R_m, C_n),$ where $(R_i, C_j)$ is address of row i, column j of the memory area, a second address generator generating such second address sequence:

$$(R_1, C_{J_1(k)}) \begin{cases} \text{, where } k = 1,2,3,\ldots,n, J_1(k) \text{ is natural} \\ \text{number not exceeding } n, \\ J_1(k_1) \neq J_1(k_2), \quad k_1, k_2 \in k, k_1 \neq k_2 \end{cases}$$

$$(R_2, C_{J_2(k)}) \begin{cases} \text{, where } k = 1,2,3,\ldots,n, J_2(k) \text{ is natural} \\ \text{number not exceeding } n, \\ J_2(k_1) \neq J_2(k_2), \forall k_1, k_2 \in k, k_1 \neq k_2 \end{cases}$$

$$\vdots$$

$$(R_m, C_{J_m(k)}) \begin{cases} \text{, where } k = 1,2,3,\ldots,n, J_m(k) \text{ is natural} \\ \text{number not exceeding } n, \\ J_m(k_1) \neq J_m(k_2), \forall k_1, k_2 \in k, k_1 \neq k_2 \end{cases}$$

$$\begin{cases} \text{, where} \\ \text{under} \quad \nabla \; m_1, m_2 \in (1, 2, \ldots, m), m_1 \neq m_2 \\ \nabla k_1, k_2 \in (1, 2, 3, \ldots, n). \\ \text{when} \quad J_{m_1}(k_1) = J_{m_2}(k_2), J_{m_1}(k_1+1) \neq J_{m_2}(k_2+1) \end{cases}$$

(where "$\nabla$" means "arbitrary"), an interleaving circuit unit for making interleaving
  by memorizing product codes comprising a first code of code length m and a second code of code length n in the memory area by using the first address generator,
  by reading the memorized product codes by using the second address generator, thereby issuing record data,
a de-interleaving circuit for making de-interleaving
  by memorizing demodulated data in the memory area by using the second address generator, and
  by reading the data memorized in the latest step, by using the first address generator, thereby issuing decoded data.

According to the interleaving circuit of the present invention, the decrease of the error correction capability of the product codes caused by the error propagation can be minimized by making the plural errors be scattered, that is, propagate to different columns depending on row.

BRIEF DESCRIPTION OF THE DRAWING

FIG. 1 is a diagram showing memory region for describing a first address sequence of an interleaving circuit of an embodiment of the present invention.

FIG. 2 is a diagram showing memory region for describing a second address sequence of the embodiment of the present invention.

FIG. 10(A), FIG. 10(B), FIG. 10(C), and FIG. 10(D) are diagrams showing error pattern with regard to the embodiment of the present invention.

DESCRIPTION OF THE PREFERRED EMBODIMENTS

Figure 3:
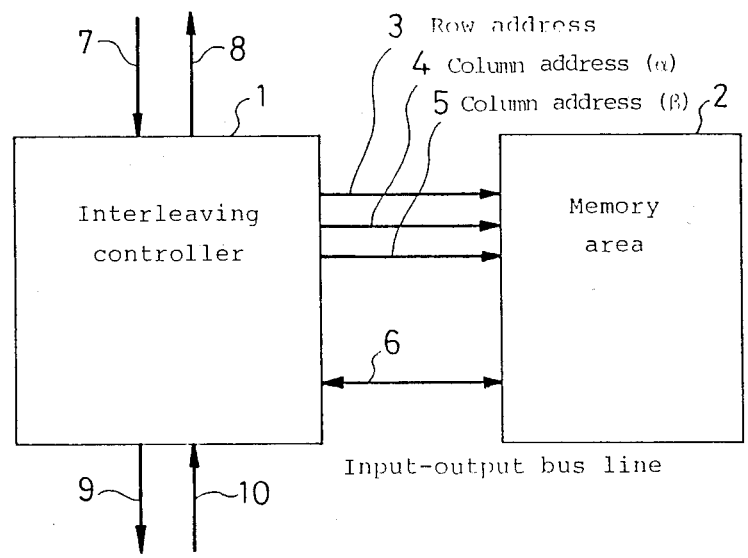
FIG. 3 is a block diagram of the embodiment of the interleaving circuit of the present invention.

FIG. 1 is a memory region diagram for showing a first address sequence of an interleaving circuit in an embodiment of the present invention. In FIG. 1, $\alpha$ and $\beta$ are elements of GF($2^4$) and GF($2^3$) respectively. The GF is a Galois field. The order $L_\alpha$ of $\alpha$ is 15 and order $L_\beta$ of $\beta$ is 7. The expressions of the elements are represented in Table 1 and Table 2: when $\alpha^4 + \alpha + 1 = 0$ and $\beta^3 + \beta + 1 = 0$.

TABLE 1

| Power expression | Vector expression | Power expression | Vector expression |
|---|---|---|---|
| 0 | 0000 | $\alpha^7$ | 1011 |
| 1 | 0001 | $\alpha^8$ | 0101 |
| $\alpha$ | 0010 | $\alpha^9$ | 1010 |
| $\alpha^2$ | 0100 | $\alpha^{10}$ | 0111 |
| $\alpha^3$ | 1000 | $\alpha^{11}$ | 1110 |
| $\alpha^4$ | 0011 | $\alpha^{12}$ | 1111 |
| $\alpha^5$ | 0110 | $\alpha^{13}$ | 1101 |
| $\alpha^6$ | 1100 | $\alpha^{14}$ | 1001 |

TABLE 2

| Power expression | Vector expression | Power expression | Vector expression |
|---|---|---|---|
| 0 | 000 | $\beta^3$ | 011 |
| 1 | 001 | $\beta^4$ | 110 |
| $\beta$ | 010 | $\beta^5$ | 111 |
| $\beta^2$ | 100 | $\beta^6$ | 101 |

The embodiment is an interleaving circuit of product codes comprising a first code of length 15 and a second code of length 106. FIG. 1 shows a memory area of (15×106) matrix. Address space of 15×106=1590 is comprised of row address 0–14 and column addresses 0–105. The column addresses 0–105 are constituted by a combination of (0, 0) element and non-zero elements 1–105 of GF($2^4$) and GF($2^3$). Further, the non-zero elements 1–105 are constituted by a product of $\alpha$ order $L_{60} = 15$ and $\beta$ order $L_\beta = 7$, since 15 and 7 are in a prime relation with each other. Numerals 1–1590 in each block of memory area shows an order of each block in accordance with a first address sequence. The first address sequence is shown as follows by such an address that is represented as (row address, column address ($\alpha$), column address ($\beta$)).

$$(0,0,0),(1,0,0),(2,0,0),\ldots,(14,0,0),$$

$$(0,\alpha,\beta),(1,\alpha,\beta),(2,\alpha,\beta),\ldots,(14,\alpha,\beta),$$

$$(0,\alpha^2,\beta^2),(1,\alpha^2,\beta^2),(2,\alpha^2,\beta^2),\ldots,(14,\alpha^2,\beta^2),$$

$$(0,\alpha^3,\beta^3),(1,\alpha^3,\beta^3),(2,\alpha^3,\beta^3),\ldots,(14,\alpha^3,\beta^3),$$

$$\vdots$$

$$(0,\alpha^{14},\beta^6),(1,\alpha^{14},\beta^6),(2,\alpha^{14},\beta^6),\ldots,(14,\alpha^{14},\beta^6),$$

$$(0,1,1),(1,1,1),(2,1,1),\ldots,(14,1,1)$$

FIG. 2 shows the memory area representing the second address sequence of the interleaving circuit of the embodiment of the present invention. Numerals 1–1590 in each block of the memory area shows an order of each block in accordance with the second address sequence. The second address sequence is shown as follows by such address that is represented as (row address, column address ($\alpha$), column address ($\beta$)).

$$(0,0,0),(0,\alpha,\beta),(0,\alpha^2,\beta^2),\ldots,(0,1,1),$$

$$(1,0,0),(1,\alpha,\beta^2),(1,\alpha^2,\beta^4),\ldots,(1,1,1),$$

$$(2,0,0),(2,\alpha,\beta^3),(2,\alpha^2,\beta^6),\ldots,(2,1,1),$$

$$(3,0,0),(3,\alpha,\beta^4),(3,\alpha^2,\beta),\ldots,(3,1,1),$$

$$(4,0,0),(4,\alpha,\beta^5),(4,\alpha^2,\beta^3),\ldots,(4,1,1),$$

$$(5,0,0),(5,\alpha^2,\beta),(5,\alpha^4,\beta^2),\ldots,(5,1,1),$$

$$(6,0,0),(6,\alpha^2,\beta^2),(6,\alpha^4,\beta^4),\ldots,(6,1,1),$$

$$(7,0,0),(7,\alpha^2,\beta^3),(7,\alpha^4,\beta^6),\ldots,(7,1,1),$$

$$(8,0,0),(8,\alpha^2,\beta^4),(8,\alpha^4,\beta),\ldots,(8,1,1),$$

$$(9,0,0),(9,\alpha^2,\beta^5),(9,\alpha^4,\beta^3),\ldots,(9,1,1),$$

$$(10,0,0),(10,\alpha^4,\beta),(10,\alpha^8,\beta^2),\ldots,(10,1,1),$$

$$(11,0,0),(11,\alpha^4,\beta^2),(11,\alpha^8,\beta^4),\ldots,(11,1,1),$$

$$(12,0,0),(12,\alpha^4,\beta^3),(12,\alpha^8,\beta^6),\ldots,(12,1,1),$$

$$(13,0,0),(13,\alpha^4,\beta^4),(13,\alpha^8,\beta),\ldots,(13,1,1),$$

$$(14,0,0),(14,\alpha^4,\beta^5),(14,\alpha^8,\beta^3),\ldots,(14,1,1),$$

The above-mentioned second address sequence is obtained by multiplying the first address of each row of the matrix memory area by multiplier $\{(\alpha, \beta), (\alpha, \beta^2), (\alpha,\beta^3), \ldots, (\alpha^4, \beta^5)\}$. (Where, multiplying of Golois field under particular definition of $0\times\alpha^i=\alpha^i$, $0\times\beta^i=\beta^i$ is executed). Hereafter $\{(\alpha, \beta), (\alpha, \beta^2), (\alpha,\beta^3), \ldots, (\alpha^4,\beta^5)\}$ is abbreviated as "multiplier".

A general formula of the above-mentioned first and second address sequence are represented as follows, provided that j-th address is represented by ADR(j)= {row address, column address ($\alpha$), column address ($\beta$)}:
(1) First address sequence:

$$ADR(j) = \{(j-1) \bmod 15, 0, 0\};$$
$$1 \leq j \leq 15$$

$$\left\{\lfloor (j-1)/15 \rfloor \bmod 15, \alpha^{\lfloor \frac{j-1}{15} \rfloor}, \beta^{\lfloor \frac{j-1}{15} \rfloor}\right\};$$
$$16 \leq j \leq 1590$$

(2) Second address sequence:

$$ADR(j) = \left\{\lfloor \frac{j-1}{106} \rfloor, 0, 0\right\}; (j-1)\bmod 106 = 0$$

$$\left\{\lfloor \frac{j-1}{106} \rfloor, \alpha^{2\lfloor \frac{j-1}{530} \rfloor \times \{(j-1)\bmod 106\}},\right.$$

$$\left.\beta^{\{\lfloor \frac{j-1}{106} \rfloor \bmod 5 + 1\}\{(j-1)\bmod 106\}}\right\};$$

$$(j-1)\bmod 106 \neq 0$$

(where, $\lfloor j \rfloor$ indicates a maximum integer not exceeding j),

FIG. 3 is a block diagram of an interleaving circuit of the embodiment of the present invention.

For an interleaving, an interleaving controller 1 memorizes coded data 7 through an input-output bus line 6 at such address of row address 3, column address ($\alpha$)4, column address ($\beta$)5 of a memory area 2, which are in accordance with the first address sequence. The interleaving controller 1 reproduces record data 9 through the input-output bus 6 from such address of row address 3, column address ($\alpha$)4, column address ($\beta$)5 of the memory area 2 which are in accordance with the second address sequence.

For a de-interleaving operation, demodulated data 10 is memorized through the input-output bus 6 at such an address of row address 3, column address ($\alpha$)4, column address ($\beta$)5 of the memory area 2, which are in accordance with the second address sequence. Next decoded data 8 is reproduced through input-output bus 6 from such address of row address 3, column address ($\alpha$)4, column address ($\beta$)5 of the memory area 2 which are in accordance with the first address sequence. The memory area comprises RAM of usual type.

Figure 4:
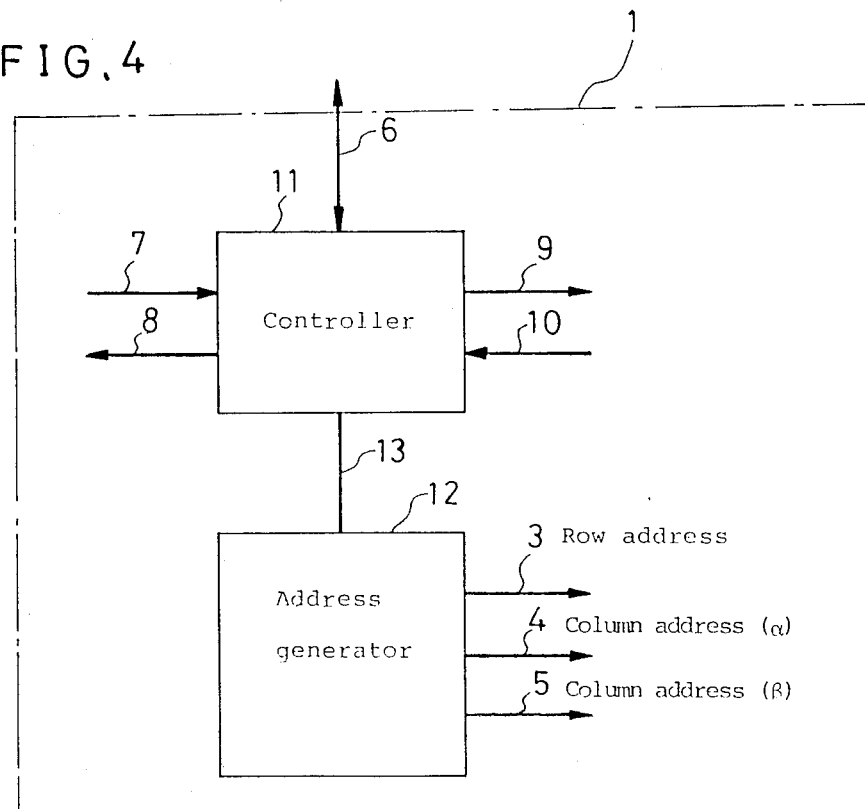
FIG. 4 is a block diagram of the embodiment of an interleaving controller in FIG. 3.

FIG. 4 is a block diagram of the interleaving controller 1. Therein, a controller 11 switches the coded data 7, decoded data 8, record data 9, demodulated data 10 and the input-output bus 6, and controls the address generator 12. The address generator 12 generates addresses in accordance with the first and second address sequence.

Figure 5:
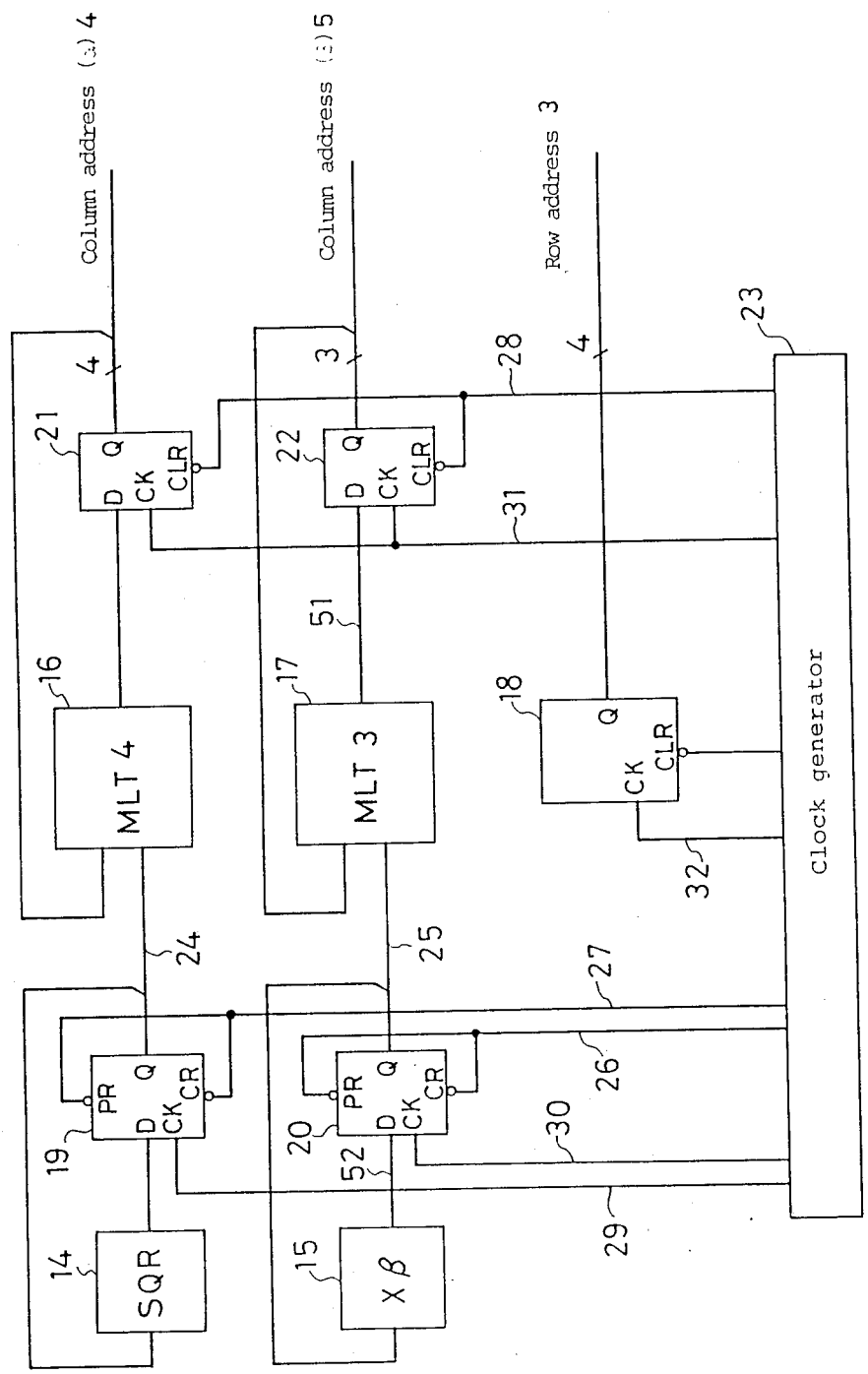
FIG. 5 is a block diagram of an address generator in FIG. 4.
Figure 6:
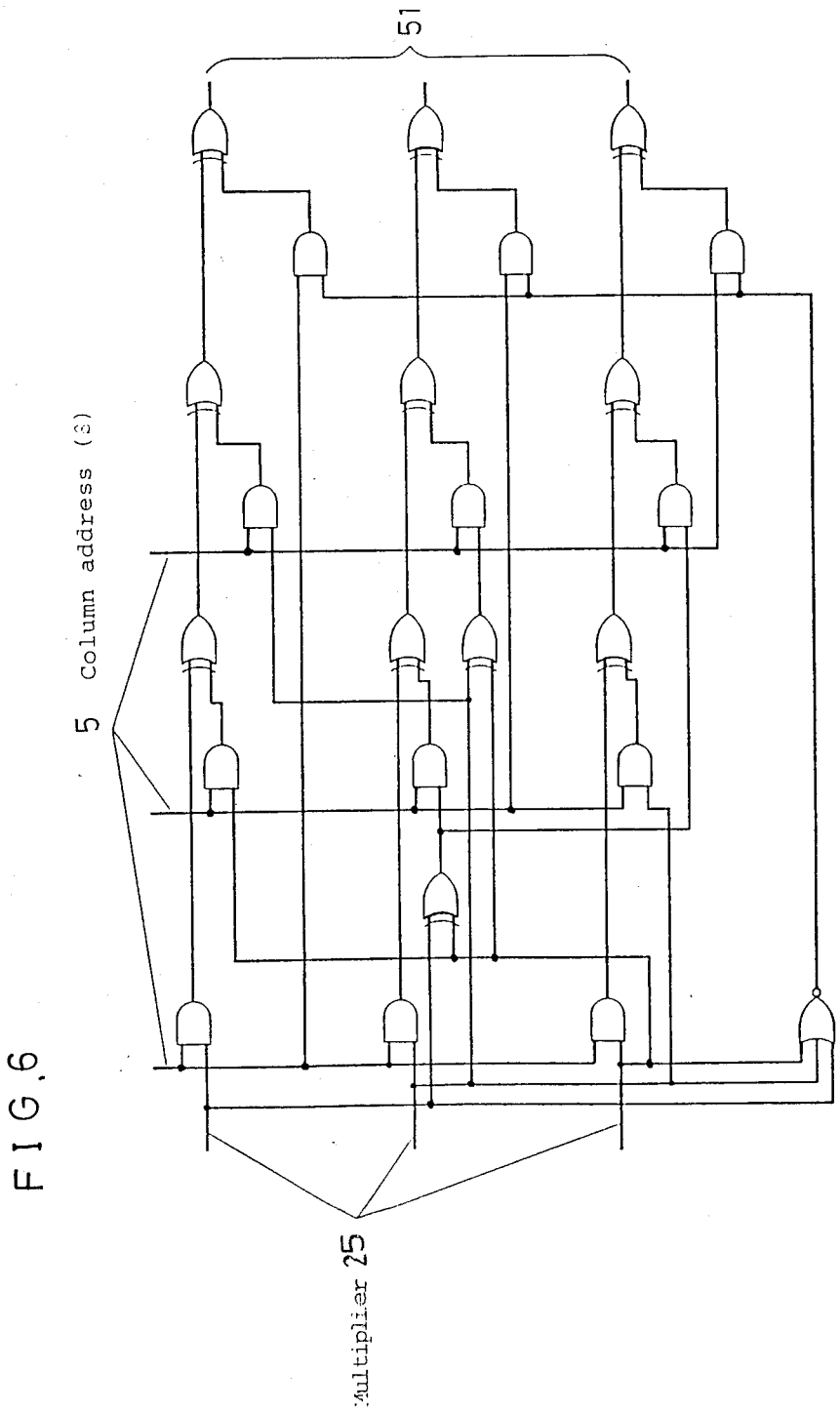
FIG. 6 is a logical circuit diagram showing a multiplier of the address generator in FIG. 5.

FIG. 5 shows the address generator 12.

Figure 8:
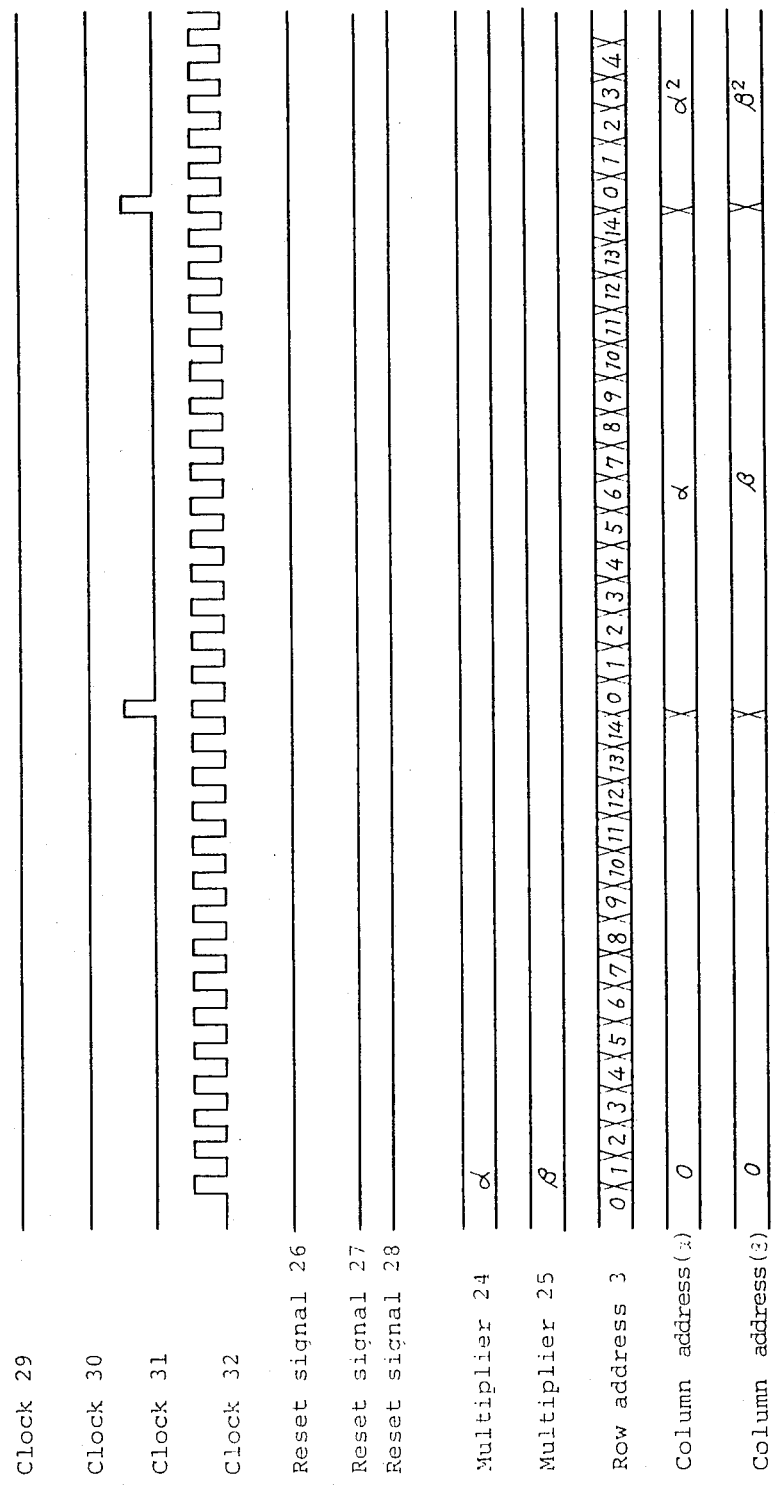
FIG. 8 is a timing chart showing an operation of the embodiment of the present invention.

In FIG. 5, an SQR circuit 14 executes a square operation at $GF(2^4)$. An $X_\beta$ circuit 15 executes $\beta$ times operation at $GF(2^3)$. A first multiplier circuit $MLT_4$ 16 is a multiplying circuit of $GF(2^4)$ (where, particular solution of $0\times\alpha^1=\alpha^i$ is issued). A second multiplier circuit $MLT_3$ 17 is a multipling circuit of $GF(2^3)$ (where, particular solution of $0\times\beta^3=\beta^i$). A circuit 18 is a tetradecimal counter of 4 bits. A circuit 19 is a D-F.F of parallel 4 bits (which issues $\alpha=(0,0,1,0)$ by receiving reset signal 27). A circuit 20 is a D-F.F of parallel 3 bits (which issues $\beta=(0,1,0)$ by receiving reset signal 26). A circuit 21 is a D-F.F of parallel 4 bits (which issues $0=(0,0,0,0)$ by receiving reset signal 28). A circuit 22 is a D-F.F of parallel 3 bits (which issues 0=(0,0,0) by receiving reset signal 28). A clock generator 23 issues clock signals 29, 30 and 31 of the D-F.F 19, 20, 21 and 22, and the reset signal 26, 27 and 28. FIG. 8 shows timing relation among the clock signals 29, 30, 31 and 32, and the reset signals 26, 27 and 28, and row address 3, column address ($\alpha$)4, column address ($\beta$)5, and multiplier 24, 25 when the first address sequence is produced.

In the first address sequence, the multiplier (24, 25 in FIG. 5) is fixed to $\alpha$ and $\beta$. Clock 32 is applied for the row address 3 for coinciding with a data transmitting velocity. Clocks 31 of the D-F.F 21, 22 of the column address is applied at the initializing (0) of the row address 3. The clock generator 23 generates the above-mentioned control signal, thereby to obtain the first address sequence.

Figure 7:
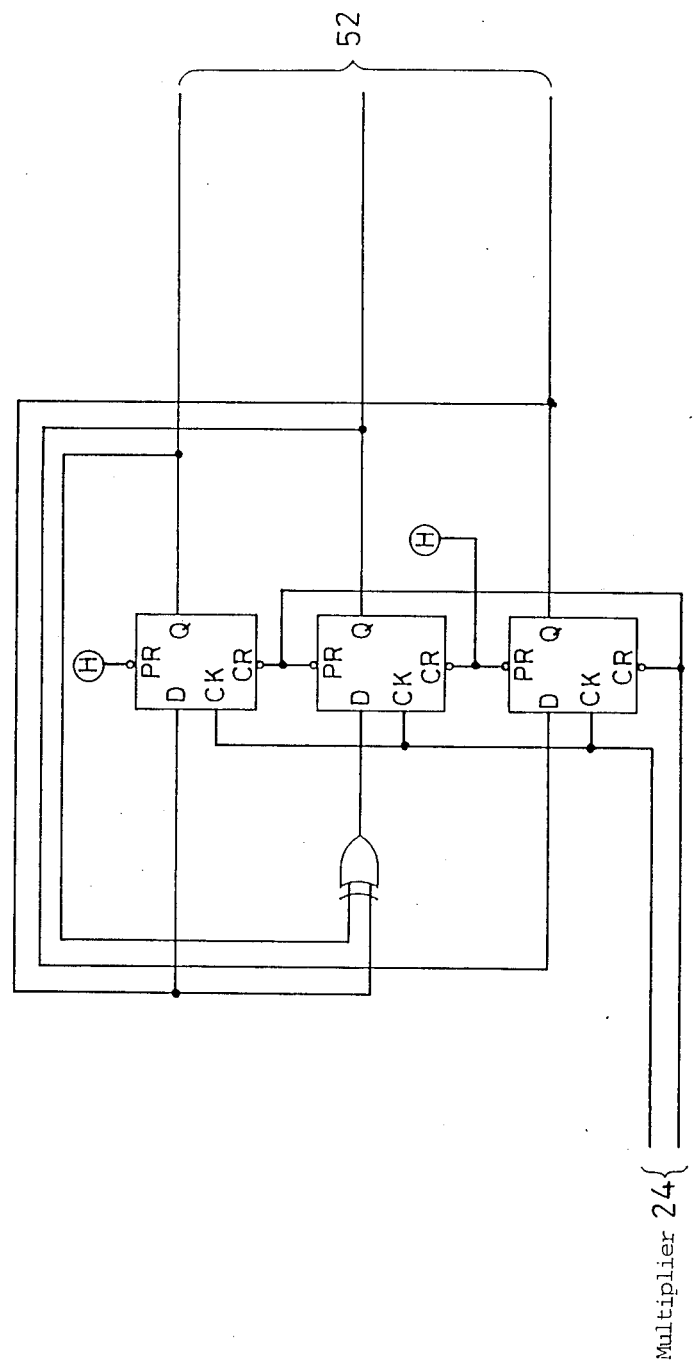
FIG. 7 is a circuit diagram showing a circuit $X_\beta$ in FIG. 5.
Figure 9:
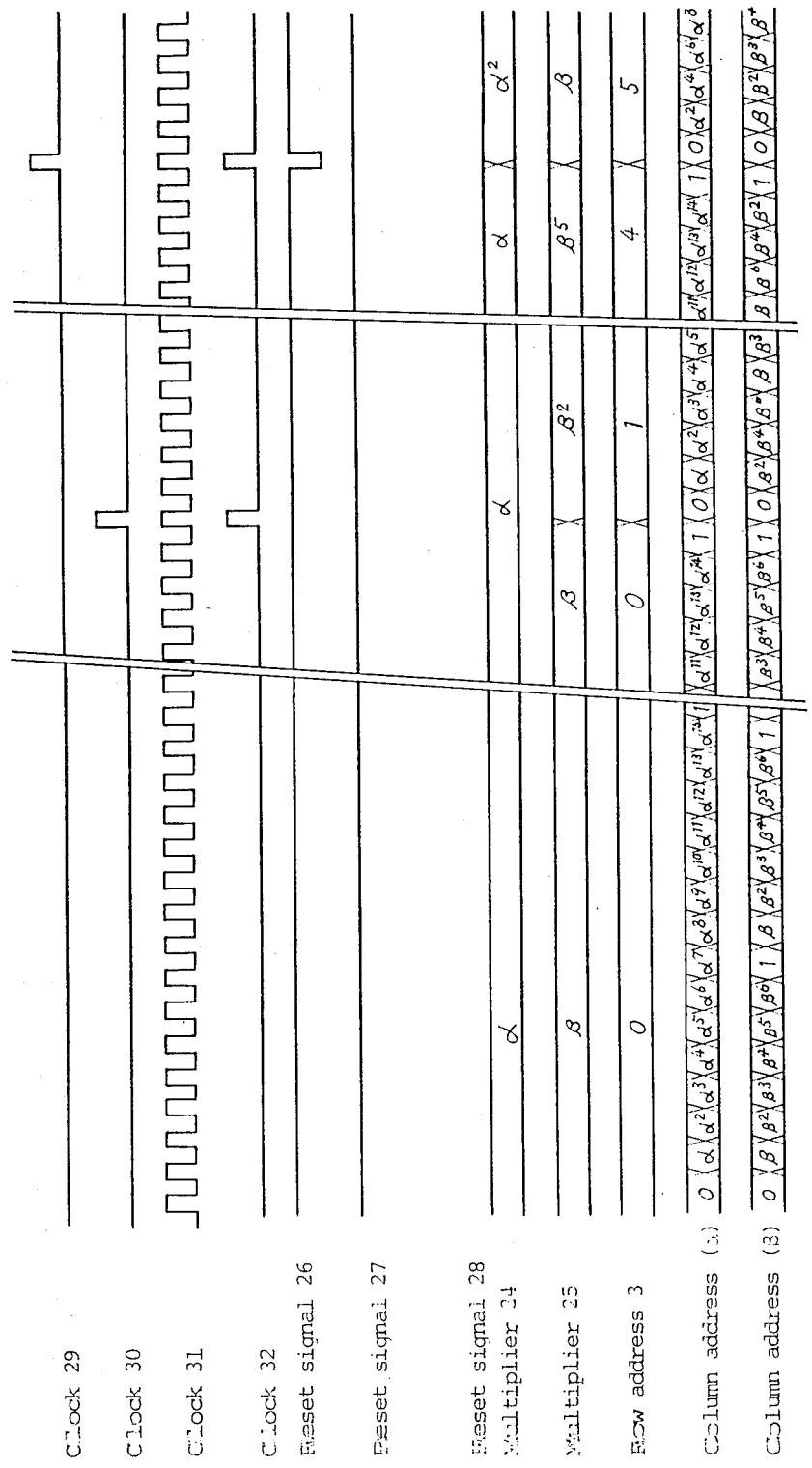
FIG. 9 is another timing chart showing an operation of the embodiment of the present invention.
Figure 11:
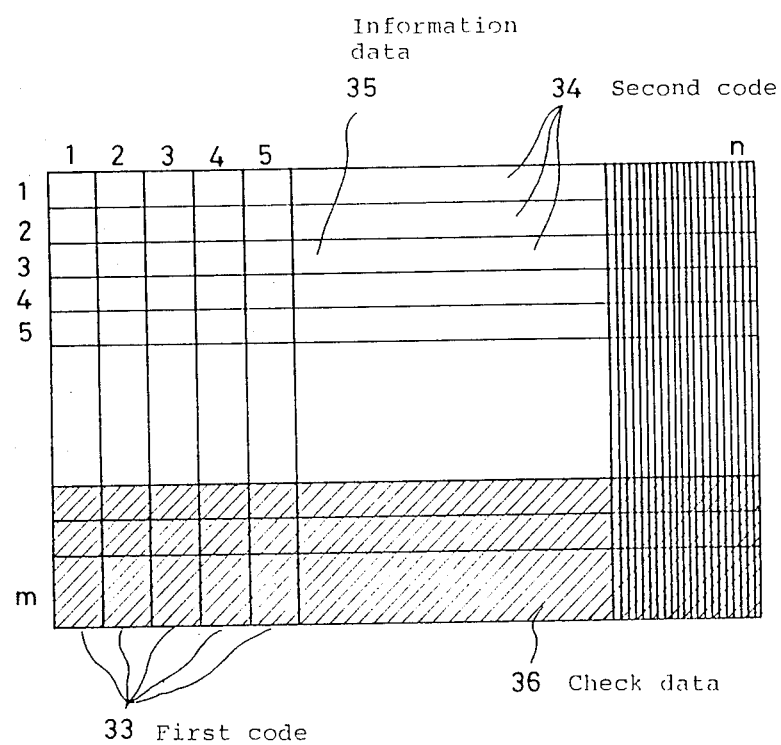
FIG. 11 is the diagram showing a principle of the general product codes.
Figure 12:
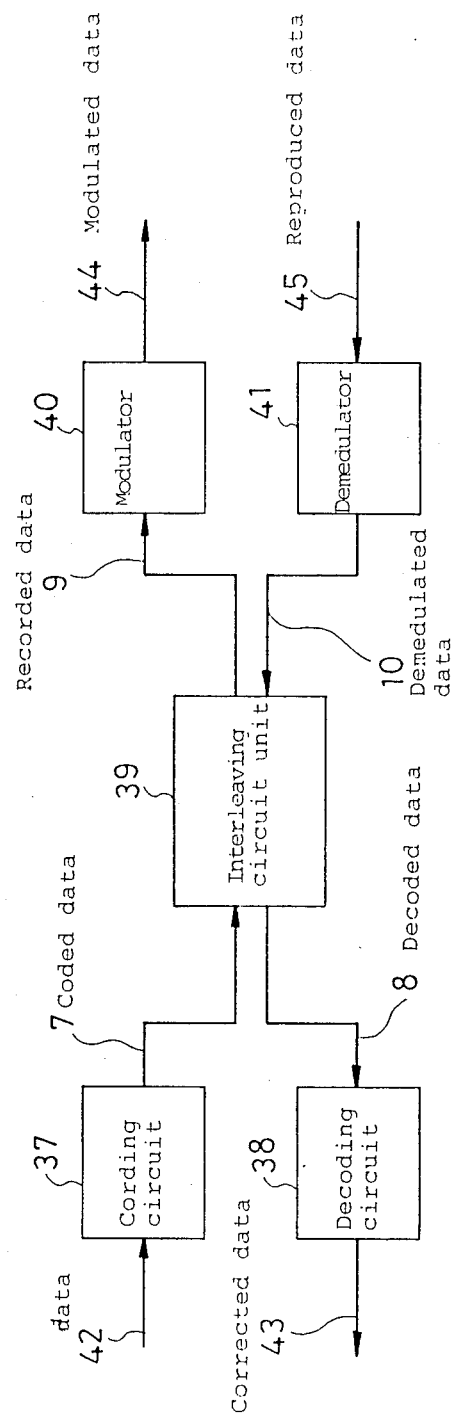
FIG. 12 is the block diagram showing the general constitution of an information recording media using the interleaving circuit of the present invention.
Figure 13:
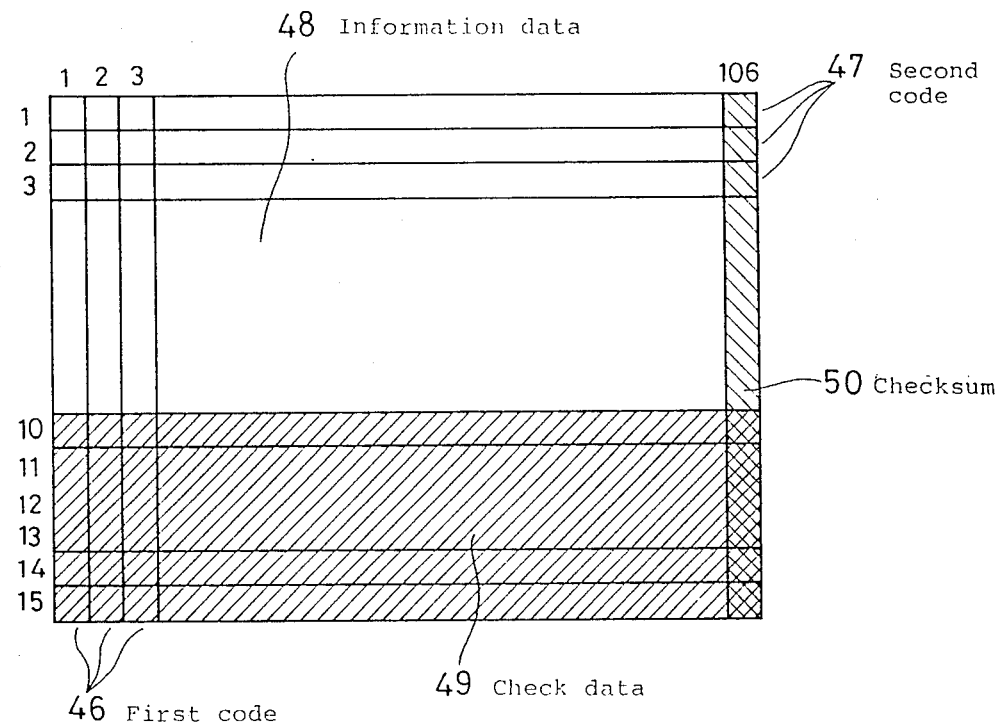
FIG. 13 is the diagram showing a principle of product codes in the above-mentioned embodiment and in the conventional interleaving circuit.
Figure 14:
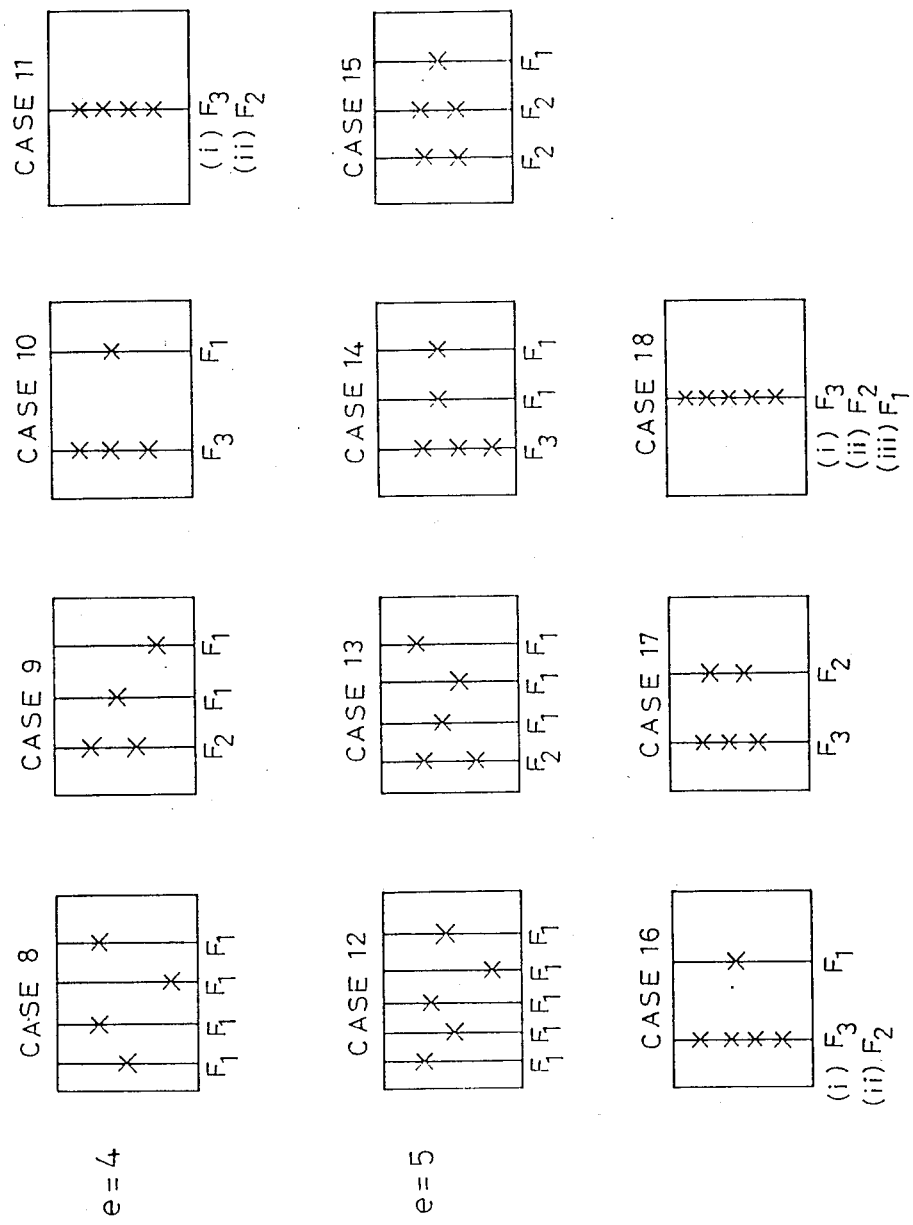
FIG. 14(A), FIG. 14(B) and FIG. 14(C) are the diagrams showing error pattern with regard to decoding of the product codes.
Figure 15:
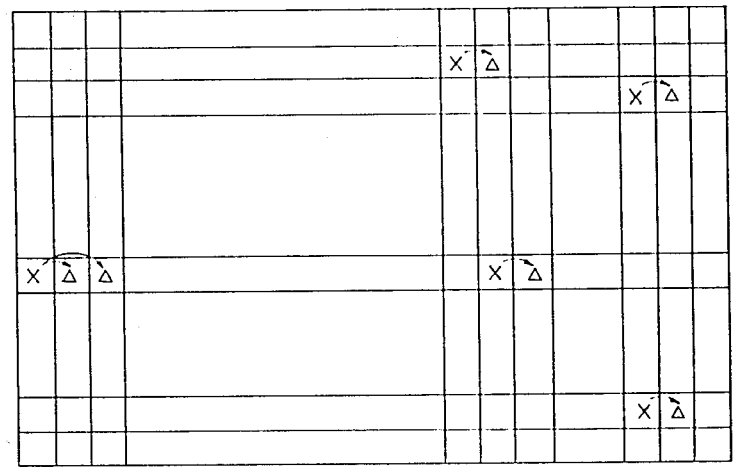
FIG. 15 is the memory area diagram showing a state of error propagation under the conventional interleaving circuit.
Figure 16:
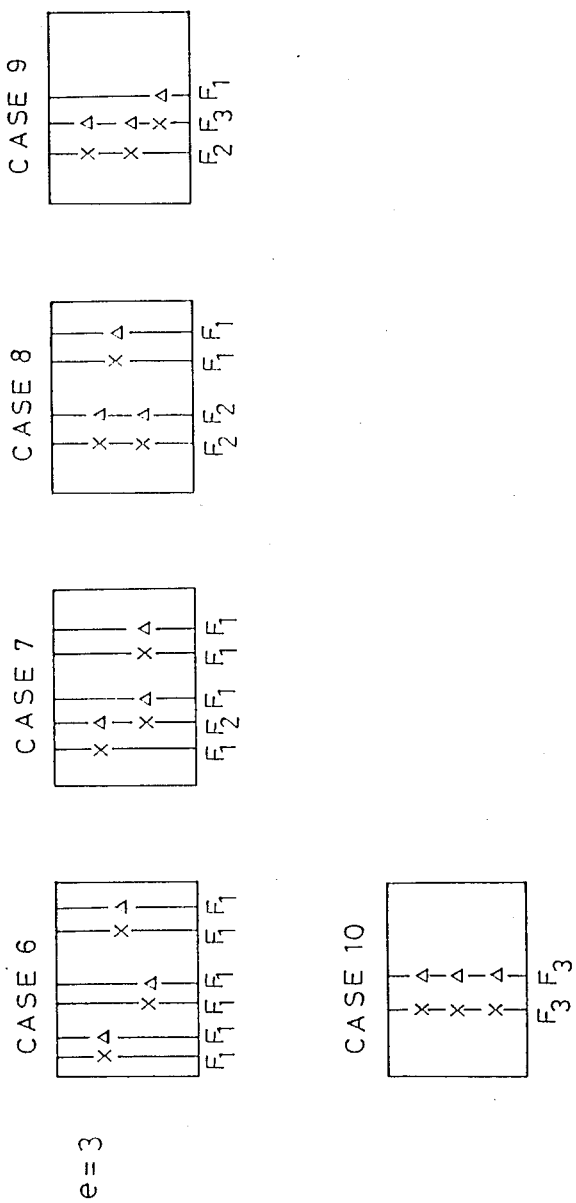
FIG. 16(A) and FIG. 16(B) are the diagrams showing error pattern with regard to decoding of the product codes when error propagation occurs using the conventional interleaving circuit.

FIG. 9 shows a timing relation among the clock signals 29, 30, 31 and 32, and reset signals 26, 27, 28, and row address 3, column address ($\alpha$)4, column address ($\beta$)5, and multipliers 24, 25 when the second address sequence is produced. The second address sequence is obtained by making clock signal 31 of the D-F.F 21, 22 of the column address coincide with the data transmitting velocity and by changing the multiplier 24, 25 and the embodiment of the multiplier circuit $MLT_3$ 17 is shown. In FIG. 7, an embodiment of the $X_\beta$ 15 is shown. The multiplier circuit $MLT_4$ 16 and the circuit SQR 14 are configurated similarly.

In the interleaving circuit of the above-mentioned embodiment, when different symbols in the same column make error, propagation of error is made to symbols in different columns with each other. Therefore, the decrease of the error correction capability of product codes induced by the error propagation can be minimized. For example, the product codes in the above-mentioned embodiment only has 2 error correction and 3 error detection capability, if the product codes are decoded in accordance with Sugimura Patent Application by using the conventional interleaving circuit having maximum distance separation and an error propagation occurs. However, by using the interleaving circuit of the present invention, the product codes can have 4 error correction and 5 error detection when product codes are decoded in accordance with the Sugimura Patent Application and an error propagation occurs. In FIG. 10(A), FIG. 10(B), FIG. 10(C) and FIG. 10(D), all error types when five symbols or less errors are produced, are shown. FIG. 10(A), FIG. 10(B), FIG. 10(C) and FIG. 10(D) show the cases when all errors are propagated to produce 5 symbol errors. Cases are classified in accordance with error number "e" occurring in the whole product codes and error number including errors induced by the error propagation in the first code 46.

Error number flags produced in the decoding processing of the first code 46 are shown under each case (but $F_0$ is not indicated). Original errors on the recording media or transmission channel are represented by X mark and errors produced by the error propagation are represented by $\Delta$ mark.

These cases are classified to decoding modes as follows:

(a) Decoding mode 1:
Cases 27, 28, 29,
(b) Decoding mode 2:
Cases 4, 6, 8, 10, 14, 15, 16, 17(i), 17(ii), 19, 23, 24, 25, 26, 30(i), 30(ii), 31(i), 32(i), 33(i), 33(ii),
(c) Decoding mode 3:
Cases 1, 2, 3, 5, 7, 9, 11, 12, 13, 18, 20, 21, 22, 31(ii), 32(ii), 33(iii).

In the decoding mode 1, detection of unconditionally un-correctable error is asserted. When classified in either of decoding modes 2 and 3, error correction is executed.

As mentioned above, in the interleaving circuit in accordance with the present invention, the combination of elements of $GF(2^3)$ and $GF(2^4)$ is used as address of the memory area, thereby to execute operation on Gabois field to produced address. And the interleaving circuit of the present invention can perform the interleaving with little influence of error propagation even by using a simple circuit.

Apart from the above-mentioned embodiment wherein Sugimura Patent Application is used for decoding product codes, the present invention is applicable to any method for decoding product codes. The present invention can be constituted by adequately selecting the order of elements of Galois field responding to each code length of the first and the second code of product codes.

Further, in the present invention, the following embodiments are executed.

(I): An interleaving circuit comprises
a memory area having (m×n) matrix blocks,
a first address generator generating such first address sequence:

$$(R_1, C_1), (R_2, C_1), (R_3, C_1), \ldots, (R_m, C_1),$$

$$(R_1, C_2), (R_2, C_2), (R_3, C_2), \ldots, (R_m, C_2),$$

$$\vdots$$

$$(R_1, C_n), (R_2, C_n), (R_3, C_n), \ldots, (R_m, C_n),$$

hereupon $(R_i, C_j)$ is address of row i, column j of the memory area, a second address generator generating such second address sequence:

$$(R_1, C_{J_1(k)}) \begin{cases} \text{where } k = 1,2,3,\ldots,n, J_1(k) \text{ is natural} \\ \text{number not exceeding } n, \\ J_1(k_1) \neq J_1(k_2), (\nabla k_1, k_2 \epsilon k, k_1 \neq k_2) \end{cases}$$

$$(R_2, C_{J_2(k)}) \begin{cases} \text{where } k = 1,2,3,\ldots,n, J_2(k) \text{ is natural} \\ \text{number not exceeding } n, \\ J_2(k_1) \neq J_2(k_2), (\nabla k_1, k_2 \epsilon k, k_1 \neq k_2) \end{cases}$$

$$\vdots$$

$$(R_m, C_{J_m(k)}) \begin{cases} \text{where } k = 1,2,3,\ldots,n, J_m(k) \text{ is natural} \\ \text{number not exceeding } n, \\ J_m(k_1) \neq J_m(k_2), (\nabla k_1, k_2 \epsilon k, k_1 \neq k_2) \end{cases}$$

, where
under $m_1, m_2 \epsilon (1, 2, \ldots, m), m_1 \neq m_2$
$k_1, k_2 \epsilon (1, 2, 3, \ldots, n).$
when $J_{m_1}(k_1) = J_{m_2}(k_2), J_{m_1}(k_1 + 1) \neq J_{m_2}(k_2 + 1)$ (where "$\nabla$" means "arbitrary")

an interleaving circuit unit for interleaving;

by memorizing product codes comprising a first code of code length m and a second code of code length n in the memory area by using the first address generator, by reading the memorized product codes by using the second address generator, thereby issuing record data, a de-interleaving circuit for de-interleaving;

by memorizing demodulated data in the memory area by using the second address generator, by reading the data memorized in the latest step, by using the first address generator, thereby issuing decoded data, and the first and second address generators generate column address by multiplication of Golois field, the column address of (m×n) matrix memory area is represented by combination of non-zero elements in each Golois field, where each element $\alpha_1, \alpha_2, \ldots, \alpha_l$ of different Golois fields are independent variable (wherein $n = L_1 \times L_2 \times \ldots L_l$ and $L_1, L_2, \ldots, L_l$ are each other prime, in case that $L_1, L_2, \ldots, L_l$ are order of each $\alpha_1, \alpha_2, \ldots, \alpha_l$).

Further, such modified embodiment can be executed.

The second address generator generates column address of the second address sequence according to such producing rule of:

$$C_{J1(k)} = \left( a\frac{h_1(1)k}{1}, a\frac{h_2(1)k}{2}, \ldots, a\frac{h_l(1)k}{l} \right); (k = 1,2,\ldots,n)$$

$$C_{J2(k)} = \left( a\frac{h_1(2)k}{1}, a\frac{h_2(2)k}{2}, \ldots, a\frac{h_l(2)k}{l} \right); (k = 1,2,\ldots,n)$$

$$\vdots$$

$$C_{Jm(k)} = \left( a\frac{h_1(m)k}{1}, a\frac{h_2(m)k}{2}, \ldots, a\frac{h_l(m)k}{l} \right); (k = 1,2,\ldots,n)$$

where $h_1(m_1), L_1$ are relatively prime $(m_1 = 1, 2, \ldots, m)$ $h_2(m_1), L_2$ are relatively prime $(m_1 = 1, 2, \ldots, m)$ $\vdots$ $h_l(m_1), L_l$ are relatively prime $(m_1 = 1, 2, \ldots, m)$ $(h_1(m_1), h_2(m_1), \ldots, h_l(m_1)) \neq (h_1(m_2), h_2(m_2), \ldots, h_l(m_2))$ against $m_1, m_2 \in (1,2,\ldots,m), m_1 \neq m_2$.

(II) An interleaving circuit comprises:

a memory area having (m×n) matrix blocks, a first address generator generating such first address sequence:

$(R_1, C_1), (R_2, C_1), (R_3, C_1), \ldots, (R_m, C_1),$ $(R_1, C_2), (R_2, C_2), (R_3, C_2), \ldots, (R_m, C_2),$ $\vdots$ $(R_1, C_n), (R_2, C_n), (R_3, C_n), \ldots, (R_m, C_n),$ wherein $(R_i, C_j)$ is address of row i, column j of the memory area, a second address generator generating such second address sequence:

$(R_1, C_{J1(k)}) \begin{cases} \text{where } k = 1,2,3,\ldots,n, J_1(k) \text{ is natural} \\ \text{number not exceeding } n, \\ J_1(k_1) \neq J_1(k_2), (\nabla k_1, k_2 \in k, k_1 \neq k_2) \end{cases}$ $(R_2, C_{J2(k)}) \begin{cases} \text{where } k = 1,2,3,\ldots,n, J_2(k) \text{ is natural} \\ \text{number not exceeding } n, \\ J_2(k_1) \neq J_2(k_2), (\nabla k_1, k_2 \in k, k_1 \neq k_2) \end{cases}$ $\vdots$ $(R_m, C_{Jm(k)}) \begin{cases} \text{where } k = 1,2,3,\ldots,n, J_m(k) \text{ is natural} \\ \text{number not exceeding } n, \\ J_m(k_1) \neq J_m(k_2), (\nabla k_1, k_2 \in k, k_1 \neq k_2) \end{cases}$ , where $\begin{cases} \text{under} & m_1, m_2 \in (1, 2, \ldots, m), m_1 \neq m_2 \\ & k_1, k_2 \in (1, 2, 3, \ldots, n). \\ \text{when} & J_{m1}(k_1) = J_{m2}(k_2), J_{m1}(k_1 + 1) \neq J_{m2}(k_2 + 1) \\ \text{(where} & \text{"}\nabla\text{" means "arbitrary")} \end{cases}$ an interleaving circuit unit for interleaving;

by memorizing product codes comprising a first code of code length m and a second code of code length n in the memory area by using the first address generator, by reading the memorized product codes by using the second address generator, thereby issuing record data, a de-interleaving circuit for de-interleaving;

by memorizing demodulated data in the memory area by using the second address generator, by reading the data memorized in the latest step, by using the first address generator, thereby issuing decoded data, and the column address of (m×n) matrix memory area is represented by combination of non-zero elements in each Golois field and combination of zero elements, where each element $\alpha_1, \alpha_2, \ldots, \alpha_l$ of different Golois fields are independent variable (wherein $= L_1 \times L_2 \times \ldots \times L_l + 1, L_1, L_2, \ldots,$ and $L_l$ are relatively prime, providing that $L_1, L_2, \ldots, L_l$ are order of each $\alpha_1, \alpha_2, \ldots, \alpha_l$).

Further, the modified embodiment can be executed.

The second address generator generates column address of the second address sequence according to such producing rule of $C_{J1(k)} = C_{J2(k)}, \ldots, C_{Jm(k)} = 0; (k = 1)$ $$C_{J1(k)} = \left( a\frac{h_1(1)k}{1}, a\frac{h_2(1)k}{2}, \ldots, a\frac{h_l(1)k}{l} \right); (k = 1,2,\ldots,n)$$

$$C_{J2(k)} = \left( a\frac{h_1(2)k}{1}, a\frac{h_2(2)k}{2}, \ldots, a\frac{h_l(2)k}{l} \right); (k = 1,2,\ldots,n)$$

$$\vdots$$

$$C_{Jm(k)} = \left( a\frac{h_1(m)k}{1}, a\frac{h_2(m)k}{2}, \ldots, a\frac{h_l(2)k}{l} \right); (k = 1,2,\ldots,n)$$

where

-continued $h_1(m_1), L_1$ are relatively prime $(m_1 = 1, 2, \ldots, m)$ $h_2(m_1), L_2$ are relatively prime $(m_1 = 1, 2, \ldots, m)$ $\vdots$ $h_l(m_1), L_l$ are relatively prime $(m_1 = 1, 2, \ldots, m)$ and $(h_1(m_1), h_2(m_1), \ldots, h_l(m_1)) \neq (h_1(m_2), h_2(m_2), \ldots, h_l(m_2))$ against $m_1, m_2 \epsilon (1, 2, \ldots, m), m_1 \neq m_2$.

As mentioned above, according to the present invention, such interleaving circuit can be obtained by a simple circuit constitution that the decrease of the error correction capability of product codes can be minimized even when a modulation method which may produce error propagation is used. Therefore, the present invention has a great industrial utility.

What is claimed is:

1. An interleaving circuit comprising:
a memory area having (m×n) matrix blocks;
first address generator means for generating a first address sequence of:

$(R_1, C_1), (R_2, C_1), (R_3, C_1), \ldots, (R_m, C_1),$ $(R_1, C_2), (R_2, C_2), (R_3, C_2), \ldots, (R_m, C_2),$ $\vdots$ $(R_1, C_n), (R_2, C_n), (R_3, C_n), \ldots, (R_m, C_n),$ where $(R_i, C_j)$ is an address of row i, column j of said memory area, and i and j are positive integers;
second address generator means for generating a second address sequence as:

$(R_1, C_{J_1(k)})$ $\begin{cases} \text{where } k = 1,2,3, \ldots, n, \text{ and } J_1(k) \text{ are natural numbers not exceeding } n, \\ J_1(k_1) \neq J_1(k_2), (\nabla k_1, k_2 \epsilon k, k_1 \neq k_2) \end{cases}$ $(R_2, C_{J_2(k)})$ $\begin{cases} \text{where } k = 1,2,3, \ldots, n, \text{ and } J_2(k) \text{ are natural numbers not exceeding } n, \\ J_2(k_1) \neq J_2(k_2), (\nabla k_1, k_2 \epsilon k, k_1 \neq k_2) \end{cases}$ $\vdots$ $(R_m, C_{J_m(k)})$ $\begin{cases} \text{where } k = 1,2,3, \ldots, n, \text{ and } J_m(k) \text{ are natural numbers not exceeding } n, \\ J_m(k_1) \neq J_m(k_2), (\nabla k_1, k_2 \epsilon k, k_1 \neq k_2) \end{cases}$ , where under $\quad m_1, m_2 \epsilon (1, 2, \ldots, m), m_1 \neq m_2$ $\quad k_1, k_2 \epsilon (1,2,3, \ldots, n),$ when $\quad J_{m_1}(k_1) = J_{m_2}(k_2), J_{m_1}(k_1 + 1) \neq J_{m_2}(k_2 + 1)$ (where "$\nabla$" means "arbitrary")

interleaving means, coupled to said memory area for interleaving information, including:
first storing means, coupled to said first address generator means, for storing product codes in said memory in the order of said first address sequence, said product codes which comprise a first code of code length m and a second code of code length n, where m and n are positive integers, and
first reading means, coupled to said second address generator means, for reading said product codes from said memory in the order of said second address sequence, thereby issuing record data; and
de-interleaving means, coupled to said memory area, for de-interleaving, including:
second storing means, coupled to said second address generator means, for storing demodulated data in said memory area in said order of said second address sequence, and
second reading means, coupled to said first address generator means, for reading said demodulated data memorized by said de-interleaving means in the order of said first address sequence, thereby issuing decoded data.

2. An interleaving circuit in accordance with claim 1, wherein
said first and second address generator means includes means for generating column addresses by multiplication of a Golois field,
said column address of (m×n) matrix memory area being represented by a combination of non-zero elements in each said Golois field, where each element $\alpha_1, \alpha_2, \ldots, \alpha_l$ of different ones of said Golois fields are independent variables wherein $n = L_1 \times L_2 \times \ldots L_l$ and $L_1, L_2, \ldots, L_l$ are all prime when $L_1, L_2, \ldots, L_l$ are in the order of each $\alpha_1, \alpha_2, \ldots, \alpha_l$.

3. An interleaving circuit in accordance with claim 2, wherein
said second address generator means includes means for generating column addresses of said second address sequence according to:

$$C_{J_1(k)} = \left( a\frac{h_1(1)k}{1}, a\frac{h_2(1)k}{2}, \ldots, a\frac{h_l(1)k}{l} \right); (k = 1,2,\ldots, n)$$

$$C_{J_2(k)} = \left( a\frac{h_1(2)k}{1}, a\frac{h_2(2)k}{2}, \ldots, a\frac{h_l(2)k}{l} \right); (k = 1,2,\ldots, n)$$

$$\vdots$$

$$C_{J_m(k)} = \left( a\frac{h_1(m)k}{1}, a\frac{h_2(m)k}{2}, \ldots, a\frac{h_l(m)k}{l} \right); (k = 1,2,\ldots, n)$$

where $h_1(m_1), L_1$ are relatively prime $(m_1 = 1, 2, \ldots, m)$ $h_2(m_1), L_2$ are relatively prime $(m_1 = 1, 2, \ldots, m)$ $\vdots$ $h_l(m_1), L_l$ are relatively prime $(m_1 = 1, 2, \ldots, m)$ $(h_1(m_1), h_2(m_1), \ldots, h_l(m_1)) \neq (h_1(m_2), h_2(m_2), \ldots, h_l(m_2))$ against $m_1, m_2 \epsilon (1, 2, \ldots, m), m_1 \neq m_2$.

4. An interleaving circuit in accordance with claim 1, wherein
said column address of (m×n) matrix memory area is represented by a combination of non-zero elements in each Golois field and a combination of zero elements, where each element $\alpha_1, \alpha_2, \ldots, \alpha_l$ of different Golois fields are independent variables (wherein = $L_1 \times L_2 \times \ldots \times L_{l+1}$, $L_1, L_2, \ldots$, and $L_l$ are relatively prime, provided that $L_1, L_2, \ldots, L_l$ are order of each $\neq 1, \alpha_2, \ldots, \alpha_l$).

5. Interleaving circuit in accordance with claim 4, wherein said second address generator means includes means for generating column addresses of said second address sequence according to:

$$C_{J1(k)} = C_{J2(k)}, \ldots, C_{Jm(k)} = 0; (k = 1)$$

$$C_{J1(k)} = \left( a \frac{h_1(1)k}{1}, a \frac{h_2(1)k}{2}, \ldots, a \frac{h_l(1)k}{l} \right); (k = 1,2, \ldots, n)$$

$$C_{J2(k)} = \left( a \frac{h_1(2)k}{1}, a \frac{h_2(2)k}{2}, \ldots, a \frac{h_l(2)k}{l} \right); (k = 1,2, \ldots, n)$$

$$C_{Jm(k)} = \left( a \frac{h_1(m)k}{1}, a \frac{h_2(m)k}{2}, \ldots, a \frac{h_l(2)k}{l} \right); (k = 1,2, \ldots, n)$$

where $h_1(m_1)$, $L_1$ are relatively prime ($m_1 = 1, 2, \ldots, m$)

$h_2(m_1)$, $L_2$ are relatively prime ($m_1 = 1, 2, \ldots, m$)

$h_l(m_1)$, $L_l$ are relatively prime ($m_1 = 1, 2, \ldots, m$)

and $(h_1(m_1), h_2(m_1), \ldots, h_l(m_1)) \neq (h_1(m_2), h_2(m_2), \ldots, h_l(m_2))$ against $m_1, m_2 \epsilon (1,2, \ldots, m)$, $m_1 \neq m_2$.

\* \* \* \* \*